(12) United States Patent
Sakata et al.

(10) Patent No.: US 9,960,383 B2
(45) Date of Patent: *May 1, 2018

(54) DISPLAY DEVICE

(71) Applicant: SONY CORPORATION, Tokyo (JP)

(72) Inventors: Tatsuya Sakata, Tokyo (JP); Makoto Miyashita, Tokyo (JP); Toyoki Takahashi, Tokyo (JP); Daiki Adachi, Tokyo (JP); Sachiko Koyama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/415,064

(22) Filed: Jan. 25, 2017

(65) Prior Publication Data
US 2017/0200912 A1   Jul. 13, 2017

Related U.S. Application Data

(63) Continuation of application No. 14/710,398, filed on May 12, 2015, now Pat. No. 9,609,771, which is a
(Continued)

(30) Foreign Application Priority Data

May 23, 2007   (JP) ................................. 2007-137116

(51) Int. Cl.
| | |
|---|---|
| *H05K 5/00* | (2006.01) |
| *G06F 1/16* | (2006.01) |
| *H01L 51/52* | (2006.01) |
| *F16M 11/10* | (2006.01) |
| *G06F 1/20* | (2006.01) |

(Continued)

(52) U.S. Cl.
CPC .......... *H01L 51/524* (2013.01); *F16M 11/10* (2013.01); *G06F 1/1601* (2013.01); *G06F 1/20* (2013.01); *H05K 1/028* (2013.01); *H05K 1/147* (2013.01); *H05K 5/0017* (2013.01); *H05K 5/0204* (2013.01); *H05K 5/0226* (2013.01); *H05K 5/0234* (2013.01); *H05K 7/00* (2013.01); *F16M 2200/08* (2013.01); *G06F 2200/1612* (2013.01); *H01L 2251/558* (2013.01); *H05K 5/03* (2013.01)

(58) Field of Classification Search
None
See application file for complete search history.

(56) References Cited

U.S. PATENT DOCUMENTS

| | | |
|---|---|---|
| 5,150,231 A | 9/1992 | Iwamoto et al. |
| 5,588,483 A | 12/1996 | Ishida |

(Continued)

*Primary Examiner* — Xanthia C Cunningham
(74) *Attorney, Agent, or Firm* — Chip Law Group

(57) ABSTRACT

A display device in the present invention includes a display panel (320) which is provided with a display screen, a T-substrate (350) which is arranged in a predetermined range narrower than the display panel (320) at the back side of the display panel (320), first flexible printed circuit substrates (450) which extend downward from the upper end of the display panel (320) and are connected to the T-substrate (350), and second flexible printed circuit substrates (460) which extend upward from the lower end of the display panel (320) and are connected to the T-substrate (350) in order to achieve more reduction in thickness when the display panel and the circuit substrate are arranged together.

1 Claim, 19 Drawing Sheets

Related U.S. Application Data continuation of application No. 13/963,243, filed on Aug. 9, 2013, now Pat. No. 9,066,414, which is a continuation of application No. 12/601,155, filed as application No. PCT/JP2008/059186 on May 20, 2008, now Pat. No. 8,542,497.

(51) Int. Cl.
| | |
|---|---|
| *H05K 7/00* | (2006.01) |
| *H05K 1/02* | (2006.01) |
| *H05K 5/02* | (2006.01) |
| *H05K 1/14* | (2006.01) |
| *H05K 5/03* | (2006.01) |

(56) References Cited

U.S. PATENT DOCUMENTS

| | | | |
|---|---|---|---|
| 6,137,683 A | 10/2000 | Lee et al. | |
| 6,377,452 B1 | 4/2002 | Sasaki et al. | |
| 6,377,454 B1 | 4/2002 | Inoue et al. | |
| 7,034,220 B2* | 4/2006 | Kim | H05K 9/0096 174/385 |
| 7,292,446 B2* | 11/2007 | Bae | H05K 7/20963 345/60 |
| 7,372,699 B2* | 5/2008 | Kim | G06F 1/1601 313/44 |
| 7,372,704 B2* | 5/2008 | Jeong | H05K 5/02 348/836 |
| 7,426,668 B2* | 9/2008 | Mukherjee | G01R 31/31724 365/201 |
| 7,468,892 B2* | 12/2008 | Mueller | H05K 7/1424 174/520 |
| 7,495,918 B2* | 2/2009 | Lee | H05K 7/20963 165/104.33 |
| 7,558,062 B2 | 7/2009 | Wang et al. | |
| 7,586,744 B2* | 9/2009 | Okuda | G02F 1/133308 313/582 |
| 7,817,425 B2* | 10/2010 | Jeong | H01L 23/3672 165/80.3 |
| 7,965,498 B2 | 6/2011 | Gotham et al. | |
| 8,419,234 B2 | 4/2013 | Kunii | |
| 2001/0050840 A1 | 12/2001 | Ueda et al. | |
| 2002/0159240 A1* | 10/2002 | Watanabe | B65D 5/509 361/752 |
| 2003/0169573 A1* | 9/2003 | Irie | H05K 5/02 361/752 |
| 2005/0047067 A1* | 3/2005 | Bang | H05K 7/20963 361/679.21 |
| 2005/0088830 A1* | 4/2005 | Yumoto | G02F 1/13452 361/749 |
| 2006/0152909 A1* | 7/2006 | Nomoto | H05K 5/02 361/730 |
| 2006/0245171 A1* | 11/2006 | Kim | H05K 5/02 361/752 |
| 2006/0274549 A1 | 12/2006 | Fukuyoshi | |
| 2006/0285294 A1* | 12/2006 | Jeong | H05K 7/20963 361/695 |
| 2007/0076384 A1* | 4/2007 | Shin | G06F 1/1601 361/752 |
| 2007/0076396 A1* | 4/2007 | Kim | H05K 5/02 361/796 |
| 2007/0223187 A1* | 9/2007 | Chou | G06F 1/1601 361/807 |
| 2007/0252919 A1 | 11/2007 | McGreevy | |
| 2007/0291444 A1* | 12/2007 | Kim | H05K 5/02 361/679.01 |
| 2008/0105799 A1 | 5/2008 | Chen | |
| 2008/0123268 A1* | 5/2008 | Taillefer | F16M 11/22 361/679.01 |
| 2008/0123272 A1 | 5/2008 | Kang | |
| 2008/0310090 A1* | 12/2008 | Oh | G02F 1/13452 361/679.02 |
| 2009/0115919 A1 | 5/2009 | Tanaka et al. | |
| 2009/0213534 A1 | 8/2009 | Sakai | |
| 2009/0268106 A1 | 10/2009 | Shimizu | |
| 2009/0284668 A1 | 11/2009 | Sawai et al. | |
| 2010/0237222 A1 | 9/2010 | Lin | |
| 2012/0224329 A1 | 9/2012 | Li et al. | |

* cited by examiner

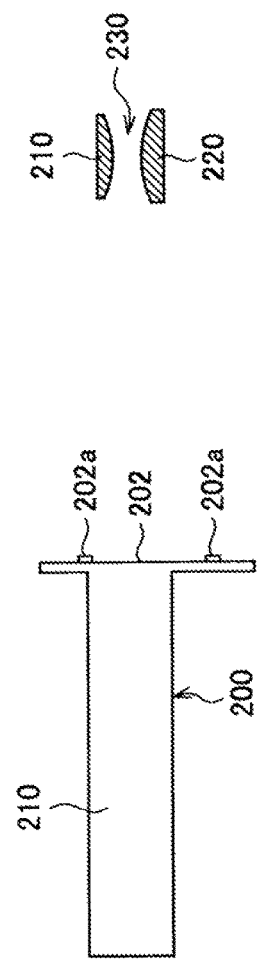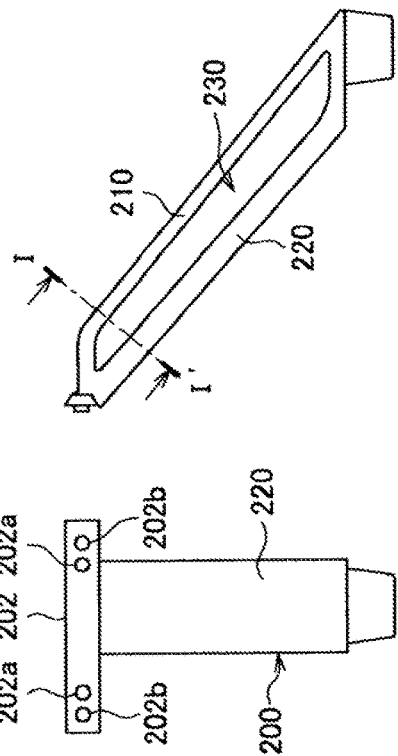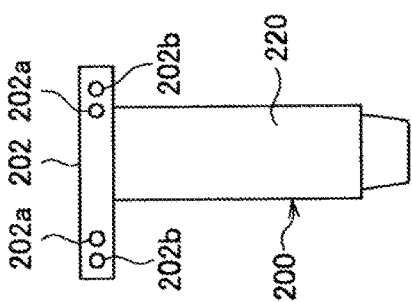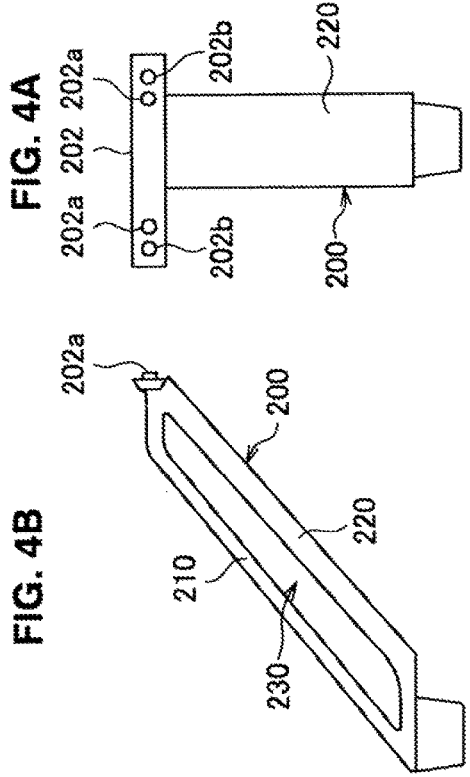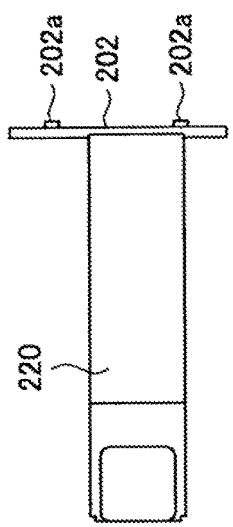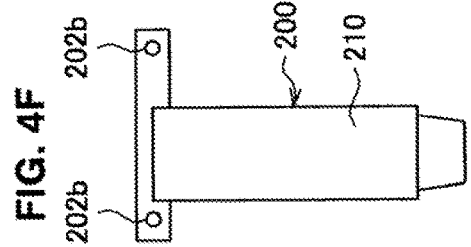

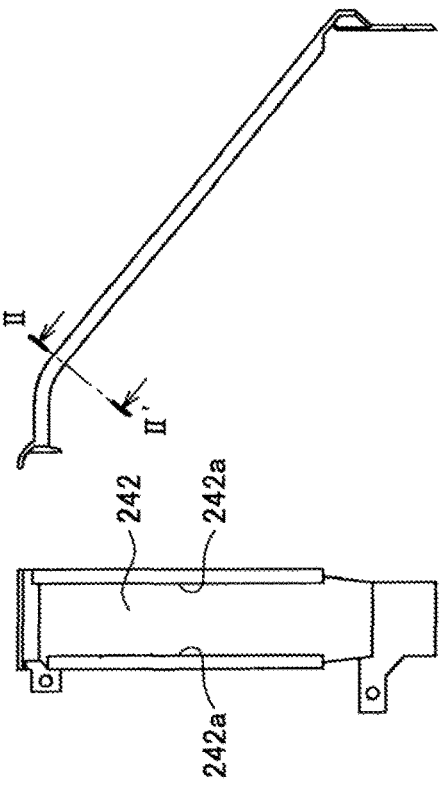
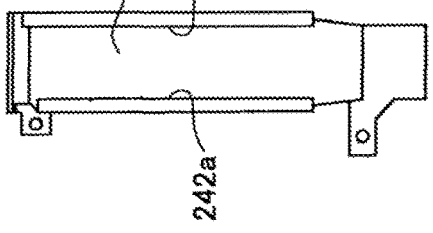
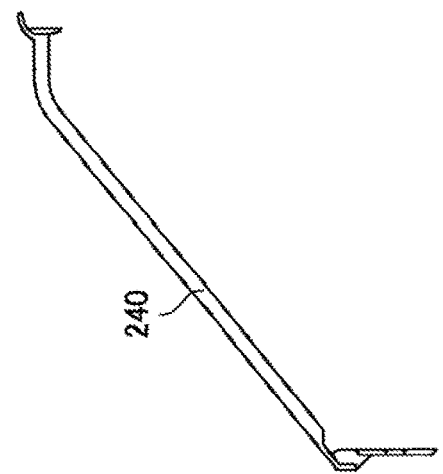
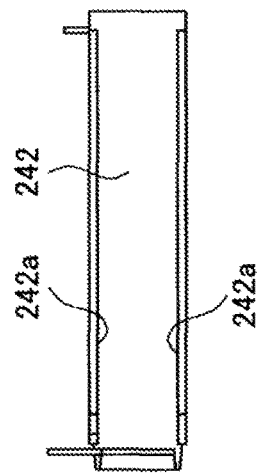
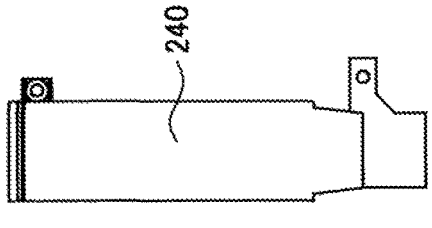

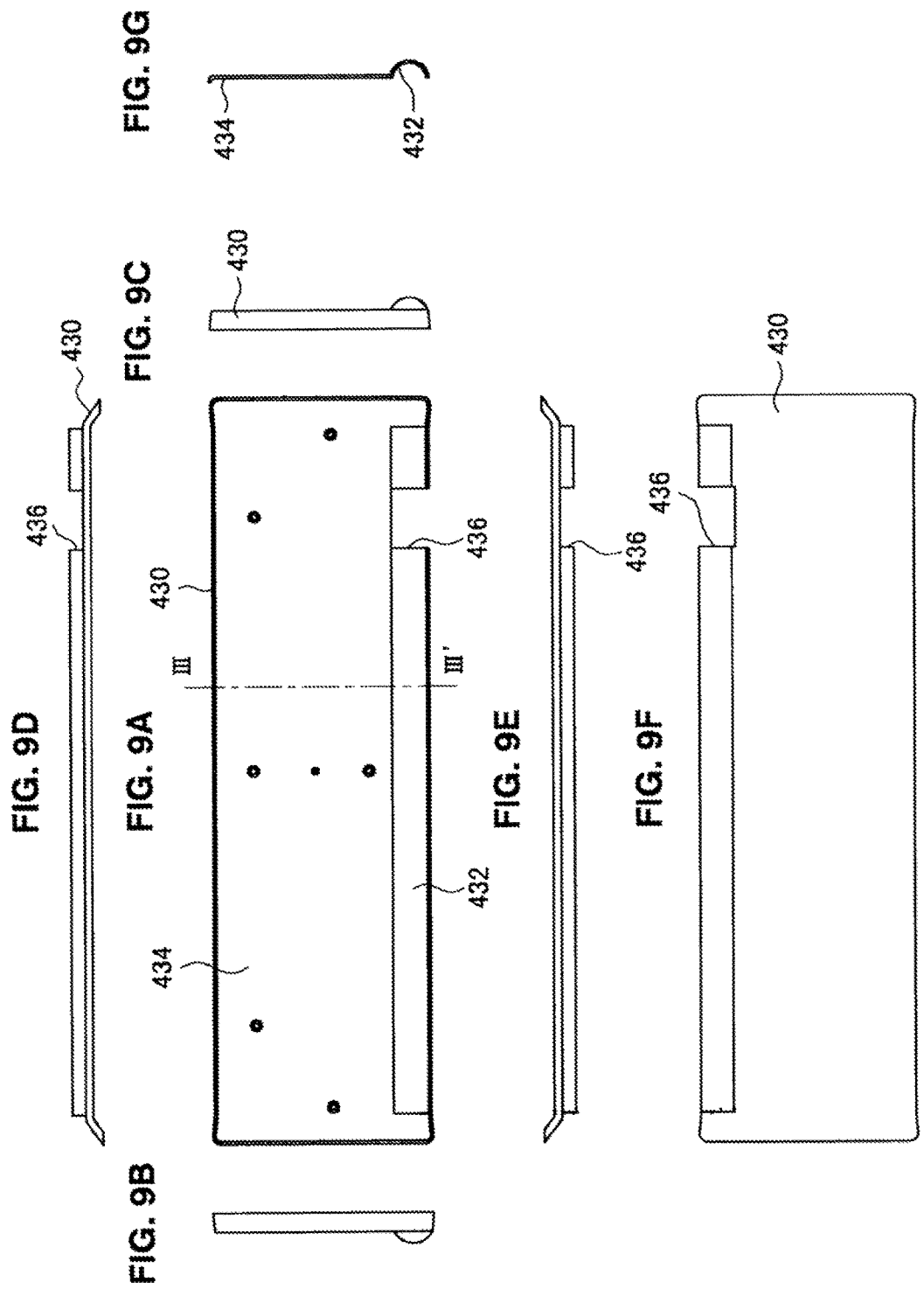

FIG. 10
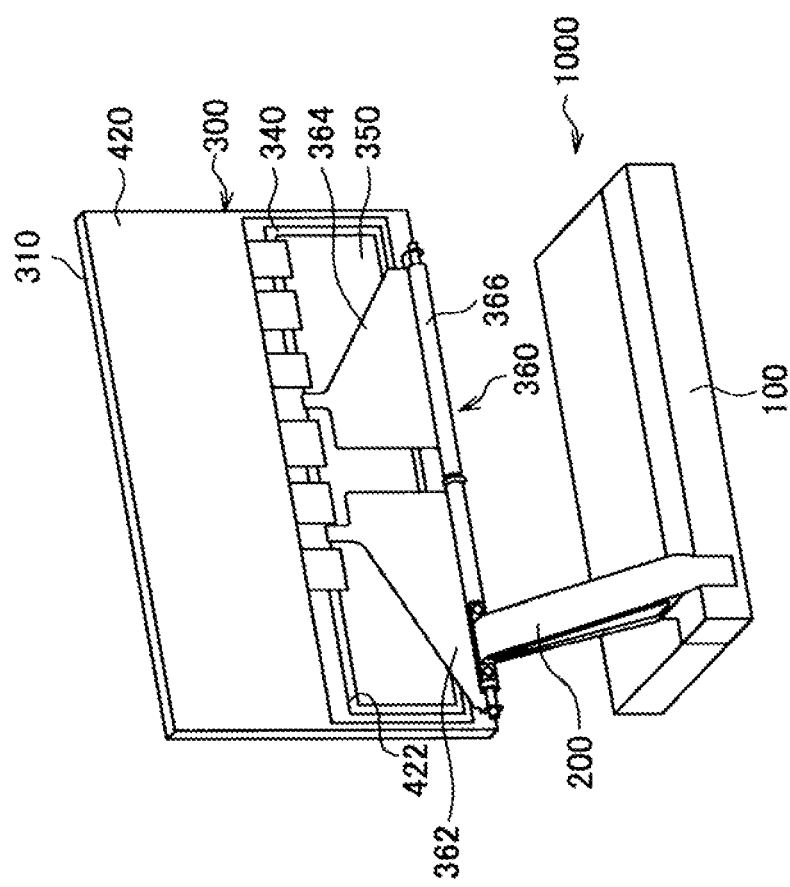

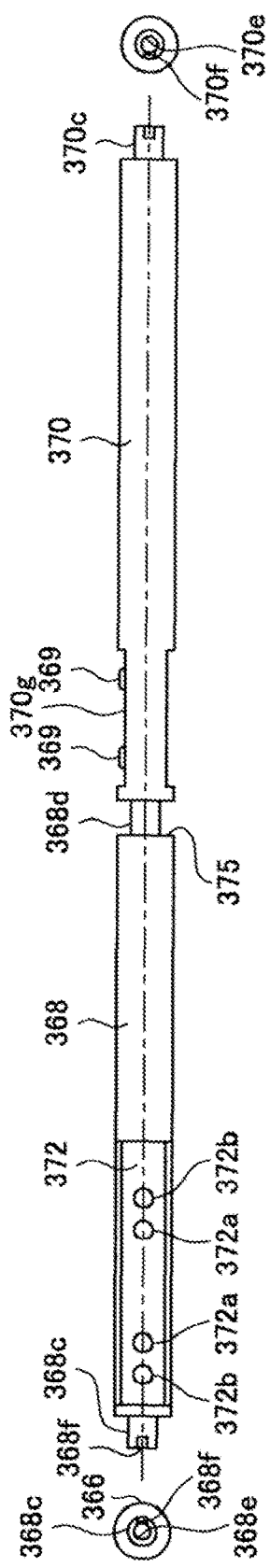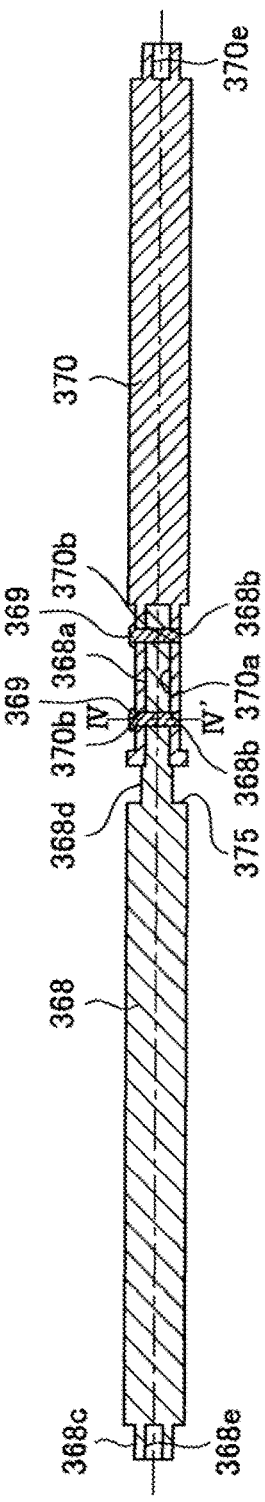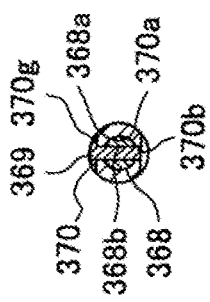

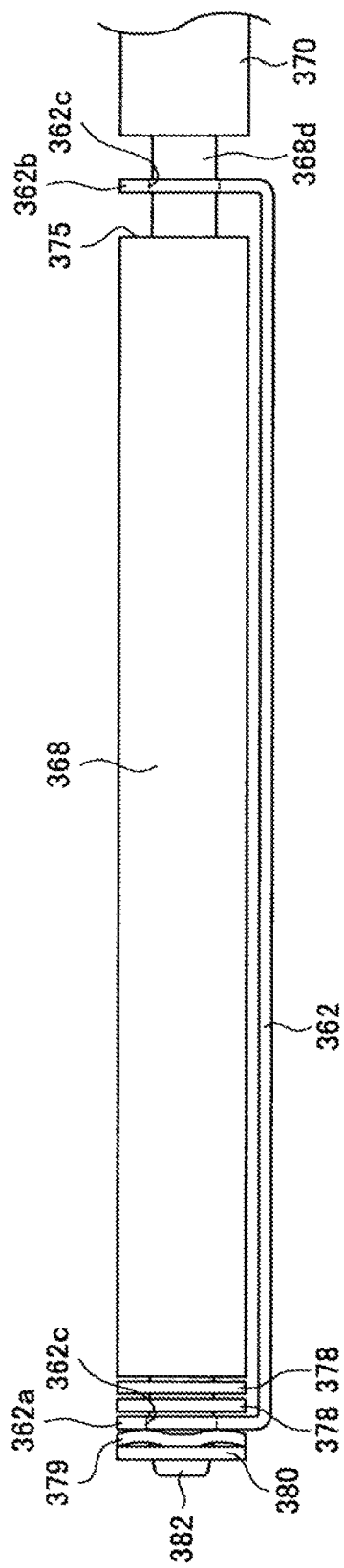

DISPLAY DEVICE

CROSS REFERENCE TO RELATED APPLICATIONS

The present application is a continuation application of U.S. patent application Ser. No. 14/710,398, filed May 12, 2015, which is a continuation application of U.S. patent application Ser. No. 13/963,243, filed Aug. 9, 2013, which is a continuation application of U.S. patent application Ser. No. 12/601,155, filed Nov. 20, 2009, which is a national stage entry of PCT application PCT/JP2008/059186 filed May 20, 2008 and which claims the benefit of Japanese Priority Patent Application 2007-137116 filed May 23, 2007, the entire contents of which are incorporated herein by reference.

TECHNICAL FIELD

The present invention relates to a display device.

BACKGROUND ART

In recent times, the thicknesses of display devices such as LCDs (liquid crystal displays) have been reduced, and a demand for even thinner display devices has been increasing. Because of this, display devices using an Organic EL (electro luminescence) panel have appeared as described in Japanese Unexamined Patent Application Publication No. 2006-84977, for example.

[Patent Document 1] Japanese Unexamined Patent Application Publication No. 2006-84977

DISCLOSURE OF THE INVENTION

Problems to be Solved by the Invention

However, when a display panel is arranged with members such as a circuit substrate for driving the display panel and electrical components within a display displaying unit, the thickness of the display displaying unit grows, and hence there is a problem that a reduction in thickness cannot be sufficiently achieved. In addition, if an arrangement of wire which connects the display panel and the circuit substrate is inadequate, there also occurs a problem that the thickness of the display displaying unit grows as well as that the external form of the display displaying unit grows.

Accordingly, the present invention has been made in view of the above problems and the present invention aims to provide a novel and improved display device capable of, when a display panel and a circuit substrate are arranged together, achieving more reduction in thickness.

Means for Solving the Problems

In order to solve the above problems, according to an aspect of the present invention, there is provided a display device which includes a display panel which is provided with a display screen, a circuit substrate which is arranged in a predetermined range narrower than the display panel at the back side of the display panel, first flexible printed circuit substrates which extend downward from the upper end of the display panel and are connected to the circuit substrate, and second flexible printed circuit substrates which extend upward from the lower end of the display panel and are connected to the circuit substrate.

According to the above configuration, the circuit substrate is arranged in a predetermined range narrower than the display panel at the back side of the display panel. The first flexible printed circuit substrates extend downward from the upper end of the display panel and are connected to the circuit substrate. Furthermore, the second flexible printed circuit substrates extend upward from the lower end of the display panel and are connected to the circuit substrate. Therefore, the first and second flexible printed circuit substrates pulled out from the upper end or lower end of the display panel enables electrical connection to the circuit substrate arranged at a predetermined range narrower than the display panel to be performed, so that the increase in thickness of the display device due to the circuit substrate can be suppressed to the minimum.

Furthermore, the circuit substrate may be arranged in a region at the lower part of the back side of the display panel. According to such a configuration, the circuit substrate does not affect the thickness of the display device at the upper part of the display panel, so that the thickness of the display panel can be suppressed to the minimum, and the thin display device can be achieved.

Furthermore, the circuit substrate may be arranged in a region less than or equal to the lower half of the back side of the display panel. According to such a configuration, the circuit substrate is arranged in a region less than or equal to the lower half of the back side of the display panel, so that the thickness of the display device can be suppressed to the minimum over a wide range of the upper side of the display device, and there can be achieved the thin display device full of feeling of lightness.

Furthermore, the first flexible printed circuit substrates may be arranged folded back downward by 180° at the upper end of the display panel, and the second flexible printed circuit substrates may be arranged folded back upward by 180° at the lower end of the display panel. According to such a configuration, the first flexible printed circuit substrates pulled out upward from the upper end of the display panel can be extended downward and connected with the circuit substrate. Furthermore, the second flexible printed circuit substrates pulled out downward from the lower end of the display panel can be extended upward and connected with the circuit substrate.

Furthermore, the first flexible printed circuit substrates may connect power supply lines to the display panel, and the second flexible printed circuit substrates may connect signal lines to the display panel. According to such a configuration, the power supply lines and signal lines necessary for driving the display panel can be connected to the display panel by the first and second flexible printed circuit substrates.

Effect of the Invention

According to the present invention, there can be provided a display device capable of, when a display panel and a circuit substrate are arranged together, achieving more reduction in thickness.

BRIEF DESCRIPTION OF THE DRAWINGS

FIGS. 4A to 4G are exemplary diagrams showing the configuration of the arm unit in detail;

FIG. 5A to 5G are exemplary diagrams showing a configuration of the cover of the arm unit in detail;

FIGS. 9A to 9G are exemplary diagrams showing a configuration of a T-cover;

FIG. 10 is an exemplary diagram showing the display device seen from the back side, with the T-cover detached therefrom.

FIGS. 14A to 14C are exemplary diagrams showing a configuration of a shaft in detail;

FIGS. 15A and 15B are exemplary diagrams showing that a first hinge plate and a second hinge plate are engaged;

EXPLANATION OF NUMERALS

Figure 1:
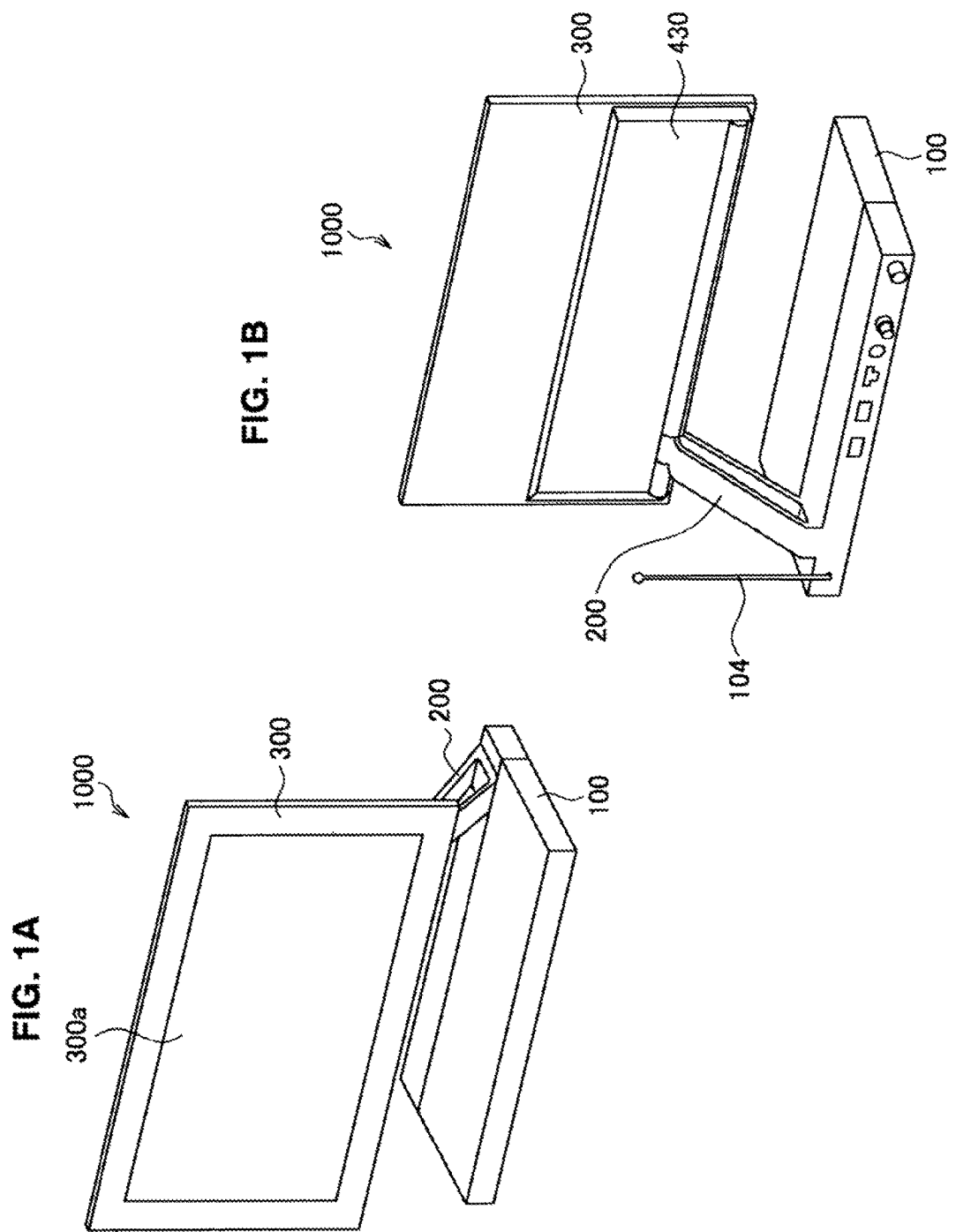
FIGS. 1A and 1B are schematic perspective views showing the external appearance of a display device according to an embodiment of the present invention.

1000: Display device
320: Organic EL panel
350: T-substrate
360: Hinge unit
450, 460: Flexible printed circuit substrates Best Mode for Carrying Out the Invention Hereinafter, a preferred embodiment of the present invention will be described in detail with reference to the accompanying drawings. Note that, in this specification and the drawings, configuration elements that have substantially the same function and configuration are denoted with the same reference numerals, and repeated explanation of these configuration elements is omitted.

Overall Configuration of the Display Device

FIGS. 1A and 1B are schematic perspective views showing the external appearance of a display device 1000 according to an embodiment of the present invention. Here, FIG. 1A is a schematic perspective view showing the display device 1000 seen from the front upper right. Furthermore, FIG. 1B is a perspective view showing the display device 1000 seen from the back upper right of the display device 1000. Furthermore, FIG. 2 is a schematic perspective view showing the display device 1000 seen from the front left side.

Figure 2:
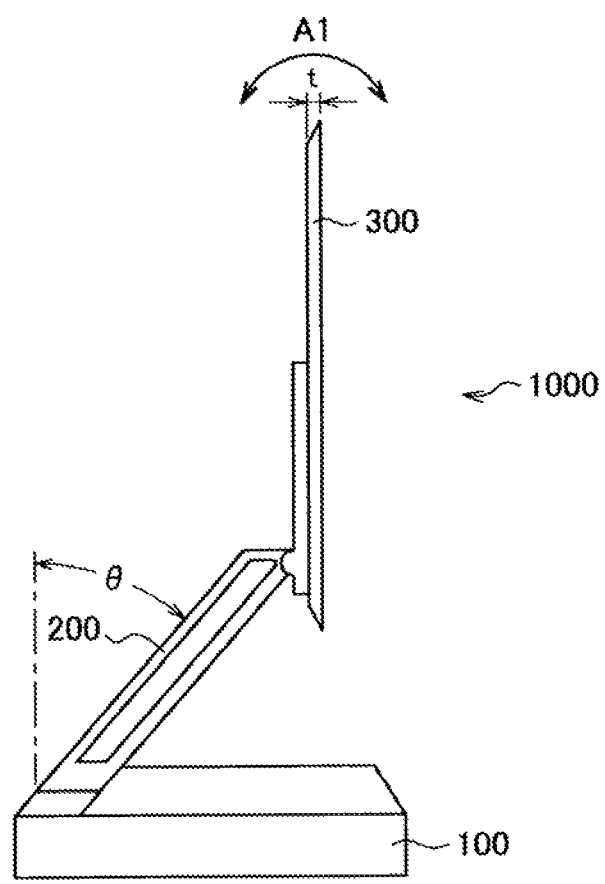
FIG. 2 is a schematic perspective view showing the display device seen from the front left side.

As shown in FIG. 1A, FIG. 1B, and FIG. 2, the display device 1000 of the present embodiment is configured including a body stand unit 100, an arm unit (supporting member) 200, and a display displaying unit 300. The display device 1000 receives, for example, television broadcasting pictures, and displays them on the display screen 300a of the display displaying unit 300.

The display displaying unit 300 includes a display panel (organic EL panel) 320 which displays images by using an organic EL (electroluminescence) phenomenon. The organic EL panel 320 is configured having a plurality of organic EL devices which are light emitting devices, and since the configuration of backlight and the like is unnecessary, it is configured to be sufficiently thin. As shown in FIG. 2, the display displaying unit 300 of the present embodiment is a thin panel having a very thin thickness, with the thickness t being suppressed to less than or equal to about several millimeters (about 3 mm).

The arm unit 200 is provided in one place at the rear of the body stand unit 100 and is arranged standing upward from the body stand unit 100. The arm unit 200 is provided, when the display device 1000 is seen from the front, on the right side from the center in the transverse direction (the horizontal direction) of the body stand unit 100, and is coupled to the right side from the center in the transverse direction of the display displaying unit 300. In this manner, in the display device 1000 of the present embodiment, the arm unit 200 is provided on either the left or right end side from the center in the horizontal direction of the display displaying unit 300, and the display displaying unit 300 is supported in a cantilever manner. Note that the arm unit 200 may be connected to the end in the horizontal direction of the display displaying unit 300. Furthermore, the cantilever structure may be made by the upper end of the arm unit 200 being connected to near the center in the horizontal direction of the display displaying unit 300 and the lower end being connected to the end of the body stand unit 100.

In the case of a LCD display, it needs a backlight, so that the thickness of the display displaying unit grows and the weight becomes heavy as well. In particular, when usage as a display not for a computer but for displaying television pictures is assumed as in the present embodiment, it requires more backlight to be arranged than a display for a computer requires, in order to secure image quality as a television receiver. Furthermore, in addition to backlights, an inverter for controlling the backlights is also necessary for a LCD display. Because of this, in the case of a LCD display, the weight becomes heavy, the rigidity of the display displaying unit including the arm unit needs to be substantially increased in order to support the display displaying unit in a cantilever manner, and there are assumed the growing complexity of the structure and the increase in weight. Therefore, it is unrealistic to support the LCD display in a cantilever manner considering user's convenience, production costs and the like.

On the other hand, an organic EL panel is formed by organic EL devices which are light emitting devices, so that a backlight and its accompanying configuration member such as an inverter are unnecessary, and it can be configured light only by a thin glass panel. Therefore, according to the present embodiment, the display displaying unit 300 itself can be configured very light, and the display displaying unit 300 can be supported in a cantilever manner.

The display displaying unit 300 is rotatable in one direction of an arrow A in FIG. 2 on the part coupled with the arm unit 200, and a user can set the tilt position of the display displaying unit 300 to a desired angle.

In the conventional display panel, the member to support the display panel, in the case of one point support, supports the middle part in the transverse direction of the display panel from the under side. Alternatively, in the case of two point support, the vicinities of the both ends in the transverse direction of the display panel are supported from the under side. In the present embodiment, the arm unit 200 is arranged shifted from the middle part in the transverse direction of the display displaying unit 300, and the display displaying unit 300 is supported in a cantilever manner, so that the arm unit 200 is out of the view of the user, which can allow the user to recognize only the display screen 300a separately. Because of this, it can give the user an impression as if the display displaying unit 300 were floating over the body stand unit 100 without the arm unit 200. Therefore, the display displaying unit 300 is supported in a cantilever manner, thereby enabling the user to pay close attention to only the display screen 300a separately.

Furthermore, the root of the arm unit 200 does not need to be coupled to the center of the body stand unit 100, so that the degree of freedom in installing the arm unit 200 can be improved. Therefore, an installation position of the arm unit 200 toward the body stand unit 100 can be determined with the internal structure of the body stand unit 100, the arrangement of substrates and the like being considered, and the degree of freedom in design can be improved. Because of this, configuration members can be most efficiently arranged upon the consideration of the internal structure of the body stand unit 100, and also the size of the display device 1000 can be suppressed to the minimum. Furthermore, since the arm unit 200 is not installed at the center of the body stand unit 100, a wide effective space can be obtained on the upper surface of the body stand unit 100, so that a display part, operation buttons, a LED display lamp, and the like can be freely arranged on the upper surface of the body stand unit 100.

Also as shown in FIG. 1A, FIG. 1B, and FIG. 2, the arm unit 200 is arranged tilted toward the back side of the display displaying unit 300 from the rear of the body stand unit 100. In FIG. 2, a tilt angle θ of the arm unit 200 with respect to a perpendicular direction is a value about 45° to 60°. Because of this, when the display displaying unit 300 is seen from the front, the arm unit 200 is hidden behind the display displaying unit 300, so that the user's recognition of the arm unit 200 can reliably be suppressed. Therefore, the arm unit 200 can be reliably suppressed from being recognized within the view of the user due to a synergetic effect with the arrangement of the arm unit 200 shifted from the center of the display displaying unit 300.

Because of this, since only the display displaying unit 300 and the body stand unit 100 appear in the view of the user, and the arm unit 200 barely comes into the view of the user, user's direct recognition of the connection of the display displaying unit 300 and the body stand unit 100 can be suppressed. Therefore, the user feels as if the display displaying unit 300 were floating in the air.

Furthermore, as described above, in the configuration of the present embodiment, the display displaying unit 300 is configured very thin with the thickness of several millimeters, so that a feeling of lightness of the display displaying unit 300 is emphatically recognized by the user. Therefore, for the user, by the synergetic effect with a feeling that the display displaying unit 300 is floating in the air, there is provided the display displaying unit 300 full of feeling of floating and lightness.

Because of this, the user can pay close attention to only the display content of the display displaying unit 300 recognized as being floating in the air, and can concentrate on seeing the display content without being distracted by other structural objects. Therefore, there can be provided the display device 1000 capable of maintaining good design while producing a feeling of floating of the display screen 300a, where the visibility of the display screen 300a is substantially improved as well.

Configuration of Arm Unit

Figure 3:
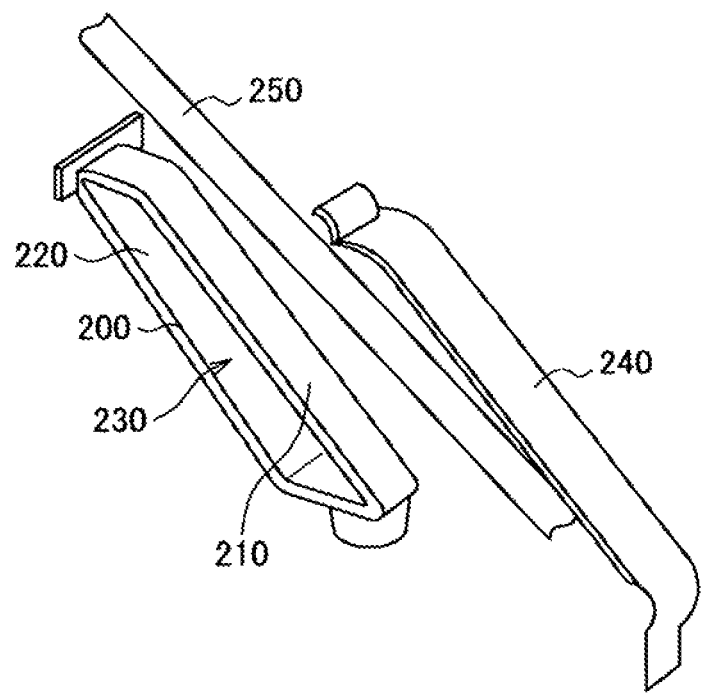
FIG. 3 is an exemplary diagram showing a configuration of an arm unit.

FIG. 3 is an exemplary diagram showing a configuration of the arm unit 200. As shown in FIG. 3, the arm unit 200 has a hollow structure, with an aperture 230 passing through the side surfaces being formed along the longitudinal direction thereof. Because of such a hollow structure, the arm unit 200 is configured by a first arm unit 210 located at the upper part and a second arm unit 220 located at the lower part. The first arm unit 210 and the second arm unit 220 are configured to have a thin flat plate shape and face each other with the aperture 230 interposed there between, and the thickness of the first arm unit 210 and the second arm unit 220 is suppressed to the minimum.

As described above, the display displaying unit 300 is configured very thin with full of feeling of lightness and floating. Therefore, also with regard to the arm unit 200 for supporting the display displaying unit 300, a configuration full of feeling of lightness and floating can be obtained similarly to the display displaying unit 300 by the thickness being suppressed to the minimum with the hollow structure, so that the feeling of lightness and floating can be emphasized as the entire display device 1000.

As described above, the weight is heavy in the case of the liquid crystal displaying display, so that the arm unit is difficult to be configured to have a hollow structure with feeling of lightness and airness, in order to ensure the strength. In the present embodiment, the display displaying unit 300 is configured by the organic EL panel 320, so that the necessary strength can be ensured even when the arm unit 200 is made to have a hollow structure. Therefore, a good design full of feeling of lightness and airness can be ensured.

A cover 240 is placed on the upper surface of the first arm unit 210. In between the upper surface of the first arm unit 210 and the cover 240 are embedded flexible printed circuit substrates 250 for electrically connecting the body stand unit 100 and the display displaying unit 300.

FIGS. 4A to 4G are exemplary diagrams showing the configuration of the arm unit 200 in detail. Here, FIG. 4A shows a front view of the arm unit 200 seen from the front of the display displaying unit 300, FIG. 4B shows a left side view, FIG. 4C shows a right side view, FIG. 4D shows a top view, FIG. 4E shows a bottom view, FIG. 4F shows a rear view, and FIG. 4G shows a cross-sectional view taken along a chain line I-I' in FIG. 4C, respectively. The body of the arm unit 200 with the cover 240 detached therefrom can be configured as a single block made of metal such as aluminum being casted or ground.

Furthermore, FIGS. 5A to 5G are_exemplary diagrams showing a configuration of the cover 240 in detail. Here, FIG. 5A shows a front view of the cover 240 seen from the front of the display displaying unit 300, FIG. 5B shows a left side view, FIG. 5C shows a right side view, FIG. 5D shows a top view, FIG. 5E shows a bottom view, FIG. 5F shows a rear view, and FIG. 5G shows a cross-sectional view taken along a chain line I-I' in FIG. 5C, respectively. As shown in FIGS. 5A to 5G, the cover 240 is provided with a concave part 242, and is configured such that the side walls 242a on both sides of the concave part 242 fit into the side surfaces in the width direction of the first arm unit 210. The flexible printed circuit substrates 250 are arranged between the first arm unit 210 and the cover 240 in a state of being accommodated at the bottom of the concave part 242. Therefore, the flexible printed circuit substrates 250 are not exposed to the external appearance.

As above, the display displaying unit 300 is configured by the organic EL panel 320, and thereby the weight of the display displaying unit 300 can be suppressed to the minimum, and the necessary strength can be ensured even when the arm unit 200 is made to have a hollow structure. The arm unit 200 is made to have a hollow structure and the volume of the arm unit 200 is suppressed to the minimum, thereby enabling the user to evoke a feeling of floating and airness with the display displaying unit 300 which is configured light and thin. Furthermore, the flexible printed circuit substrates 250 are embedded in the first arm unit 210, thereby enabling a configuration which prevents the user from being aware of the existence of the wire.

Configuration of Display Displaying Unit

Figure 6:
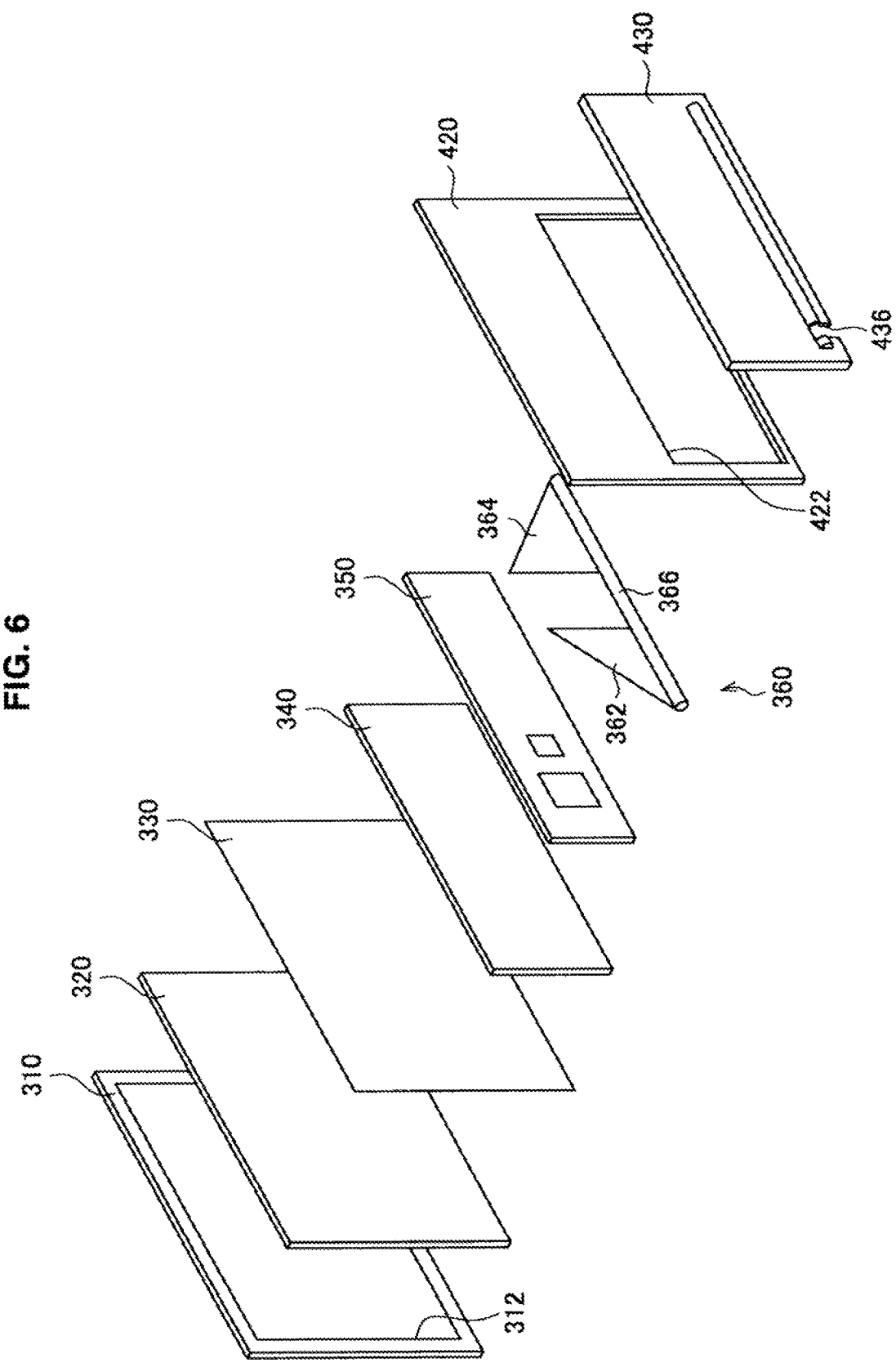
FIG. 6 is an exploded perspective view showing a configuration of a display displaying unit.

FIG. 6 is an exemplary diagram showing a configuration of the display displaying unit 300 and shows an exploded perspective view of the display displaying unit 300. As shown in FIG. 6, the display displaying unit 300 is configured to include a bezel 310, the organic EL panel 320, a graphite sheet 330, a base plate 340, a T-substrate 350, a hinge unit 360, a rear cover 420, and a T-cover 430.

The base plate 340 is a member which forms the main frame of the display displaying unit 300 and the arm unit 200 is coupled to the base plate 340 via the hinge unit 360. Furthermore, the main configuration members such as the organic EL panel 320, the T-substrate 350, and the hinge unit 360 are fixed to the base plate 340. The main members configuring the display displaying unit 300 such as the organic EL panel 320, the T-substrate 350, a hinge unit 360, the rear cover 420, and the T-cover 430 are all placed by reference to the base plate 340.

The graphite sheet 330 is attached to the back surface of the organic EL panel 320. The organic EL panel 320 is fixed to the base plate 340 by adhesive tape with the surface to which the graphite sheet 330 is attached opposed to the base plate 340.

The T-substrate 350 is made of hard substrate and are connected with power supply lines and signal lines connected with the organic EL panel 320. The size of the T-substrate 350 corresponds to the size of the base plate 340, and the T-substrate 350 is fixed to the opposite side of the base plate 340 from the surface to which the organic EL panel 320 is fixed.

The hinge unit 360 is a configuration member for coupling the arm unit 200 and the base plate 340. The hinge unit 360 is configured to include configuration members such as a first hinge plate 362 and a second hinge plate 364 made of metal having a planar triangular shape, and a shaft 366 made of metal. The shaft 366 is arranged horizontally along the lower end of the display displaying unit 300. The first hinge plate 362 and the second hinge plate 364 are fixed to the base plate 340, and are rotatably attached to the shaft 366. On the other hand, the shaft 366 is fixed to the arm unit 200. Therefore, the base plate 340 can be rotated with respect to the shaft 366 fixed to the arm unit 200, in which case the central axis of rotation is the central axis of the shaft 366. Because of this, the display displaying unit 300 can be rotated in the direction of the arrow A in FIG. 2 as described above, and the tilt angle of the display displaying unit 300 can be changeable.

The bezel 310 is a member which is attached to the edge of the organic EL panel 320 and forms an external appearance of the edge of the display displaying unit 300. The rear cover 420 and the T-cover 430 are metal covers which cover the back side of the display displaying unit 300. The rear cover is provided with an aperture 422 in a portion corresponding to the position of the T-substrate 350 and the hinge unit 360, and mainly covers the upper part of the back side of the display displaying unit 300. On the other hand, T-cover 430 is attached corresponding to the position of the aperture 422, and is configured so as to cover the T-substrate 350 and the hinge unit 360.

The base plate 340, the T-substrate 350, and the hinge 360 unit are all provided only in the region of less than or equal to the lower half of the display displaying unit 300, and the area occupied by the base plate 340, the T-substrate 350 and the hinge 360 unit with respect to the area of the entire display displaying unit 300 is suppressed to the minimum. On the other hand, in the region other than where the base plate 340, the T-substrate 350, and the hinge 360 unit are arranged, the thickness of the display displaying unit 300 is mainly determined only by the three members of the organic EL panel 320, the graphite sheet 330, and the rear cover 420. Therefore, particularly in the region including the upper half of the display displaying unit 300, the thickness of the display displaying unit 300 can be made very thin and the thickness can be suppressed to about 3 mm as described above.

Since the display device 1000 is usually placed on a desk or the like, the user rarely sees the display displaying unit 300 from the underside, and the thickness of the display displaying unit 300 is recognized from the upper side. Therefore, the thinness of the display displaying unit can be emphasized to the user by the members such as the base plate 340, the T-substrate 350, and the hinge unit 360 being arranged on the lower side and the thickness of the upper side of the display displaying unit 300 being suppressed to the minimum. Therefore, good design can be maintained while producing the abovementioned feeling of floating and airness.

Figure 7A:
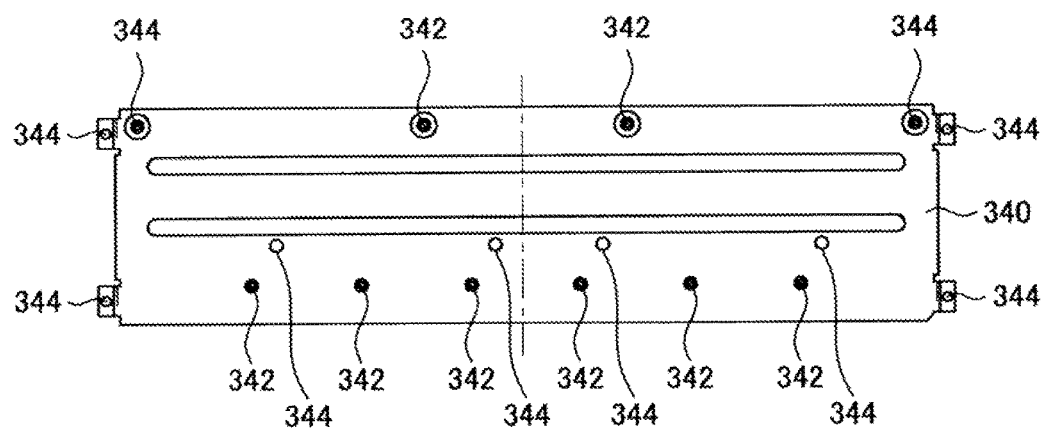
FIGS. 7A to 7C are plane views showing a configuration of a base plate.
Figure 7B:
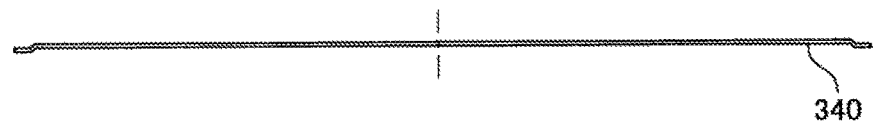
Figure 7C:
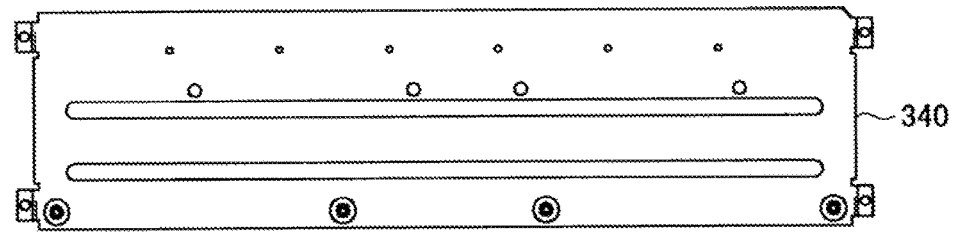

FIGS. 7A to 7C are plane views showing a configuration of the base plate 340. Here, FIG. 7A shows a front view of the base plate 340 seen from the back side of the display displaying unit 300, FIG. 7B shows a bottom view of FIG. 7A, and FIG. 7C shows a rear view of FIG. 7A, respectively. The base plate 340 is configured from a press molded metal plate. As shown in FIGS. 7A to 7C, a plurality of screw holes 342 and 344 are formed in the base plate 340. The screw holes 342 are used to fix the first hinge plate 362 and the second hinge plate 364. The other screw holes 344 are used to fix the configuration elements of the display displaying unit 300 such as the T-substrate 350 and the T-cover 430.

The bezel 310 is fixed to the circumferential edge of the organic EL panel 320 by adhesion. As shown in FIG. 6, an aperture 312 for exposing the display screen 300a of the organic EL panel 320 is provided in the bezel 310.

Figure 8B:
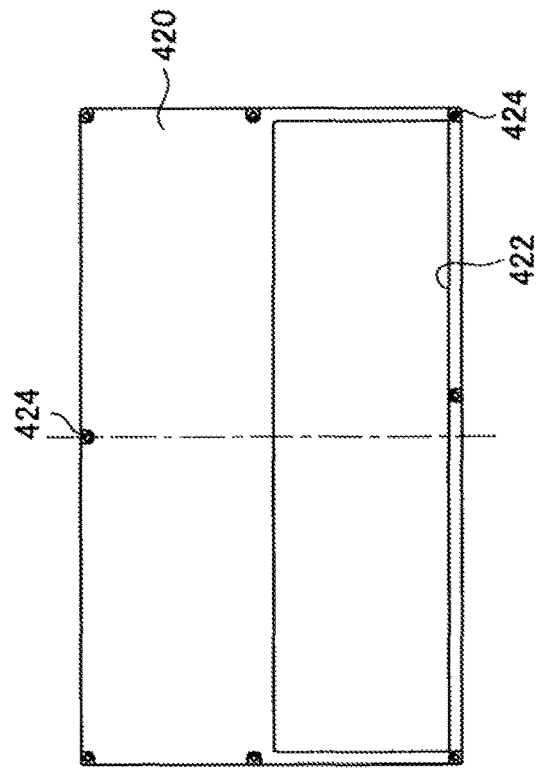
FIGS. 8A and 8B are exemplary diagrams showing a configuration of a rear cover.
Figure 8A:
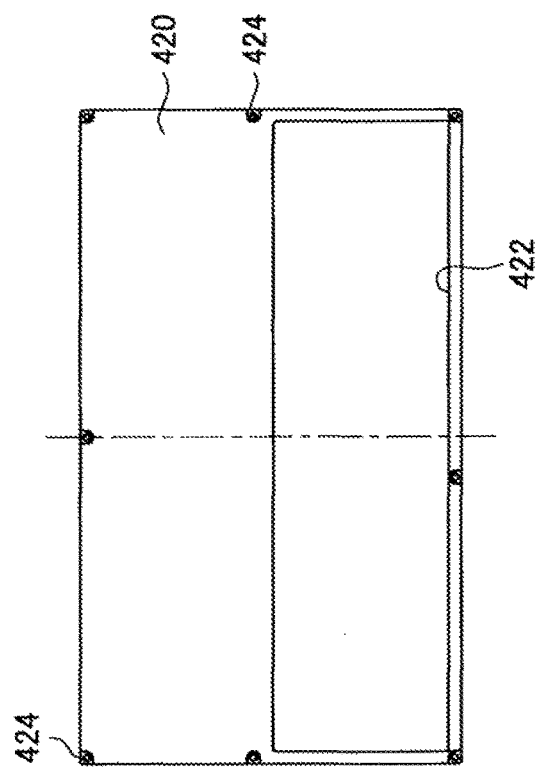

FIGS. 8A and 8B are exemplary diagrams showing a configuration of the rear cover 420. Here, FIG. 8A shows a front view of the rear cover 420 seen from the front of the display displaying unit 300, and FIG. 8B shows a rear view of the rear cover 420 seen from the back side of the display displaying unit 300, respectively.

Furthermore, FIGS. 9A to 9G are exemplary diagrams showing a configuration of the T-cover 430. Here, here, FIG. 9A shows a front view of the T-cover 430 seen from the front of the display displaying unit 300, FIG. 9B shows a left side view, FIG. 9C shows a right side view, FIG. 9D shows a top view, FIG. 9E shows a bottom view, FIG. 9F shows a rear view, and FIG. 9G shows a cross-sectional view taken along a chain line III-III' in FIG. 9A, respectively.

As shown in FIGS. 8A and 8B, the rear cover 420 is provided with an aperture 422 corresponding to the positions of the base plate 340, the T-substrate 350, and the hinge unit 360. Furthermore, the rear cover 420 is provided with a through-hole 424 into which a screw to fix the rear cover 420 is inserted. The rear cover 420 is fixed to the bezel 310 and covers the upper part of the back side of the organic EL panel 320 as described later.

FIG. 10 shows the display device 1000 seen from the back side with the T-cover 430 detached therefrom. The base plate 340, the T-substrate 350, and the hinge unit 360 are arranged in the region of the lower side of the display displaying unit 300, and when the T-cover 430 is detached, the T-substrate 350 and the hinge unit 360 are exposed to the external appearance from the aperture 422 of the rear cover 420.

As shown in FIGS. 9A to 9G, the T-cover 430 is provided with a concave part 432 corresponding to the shaft 366 of the hinge unit 360 and a concave part 434 corresponding to the region where the base plate 340, the T-substrate 350, the first hinge plate 362, and the second hinge plate 364 are arranged. Furthermore, the T-cover 430 is provided with a cut out part 436 at the position corresponding to the arm unit 200.

When the T-cover 430 is placed on the rear cover 420, the shaft 366 is accommodated in the concave part 432, and the T-substrate 350, the first hinge plate 362, and the second hinge plate 364 are accommodated in the concave part 434. Because of this, the configuring members such as the T-substrate 350 and the hinge unit 360 are covered by the T-cover 430 as shown in FIG. 1B. Furthermore, the arm unit 200 projects backward from the cut out part 436 of the T-cover 430.

Therefore, only the rear cover 420, the T-cover 430, and the arm unit 200 are exposed to the external appearance at the back side of the display displaying unit 300, so that a very simple and sophisticated external appearance can be configured. Especially in the upper side of the display displaying unit 300, the configuration members related to the thickness are mainly the three members of the organic EL panel 320, the graphite sheet 330, and the rear cover 420, so that there can be configured the very thin display displaying unit 300 with feeling of floating and lightness. Furthermore, the base plate 340 is a rigid member of the display displaying unit 300 and the main configuration elements of the display displaying unit 300 are fixed to the base plate 340, so that there can be configured the display displaying unit 300 having the sufficient strength while being very thin.

Configuration of Hinge Unit

Figure 11:
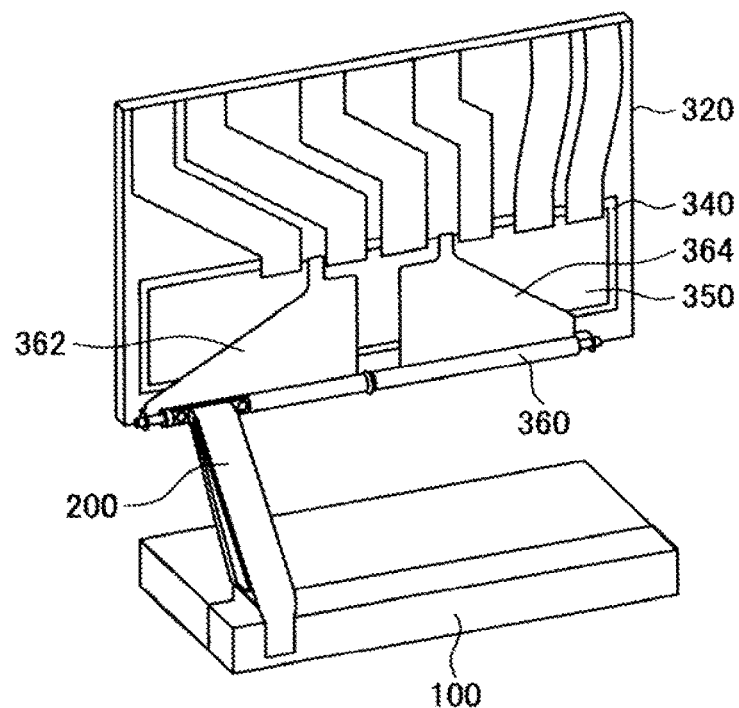
FIG. 11 is an exemplary diagram showing the display device in FIG. 10, with members such as the rear cover and a bezel detached therefrom.

FIG. 11 is a view showing the display device 1000 seen from the back side where members such as the rear cover 420 and the bezel 310 are detached from the state in FIG. 10. Furthermore, FIG. 12 is a perspective view showing a configuration of the hinge unit 360.

Figure 13C:
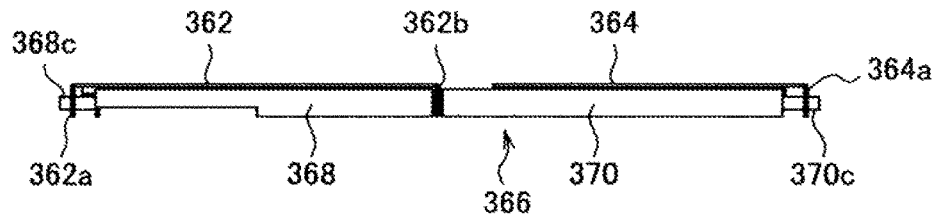
FIGS. 13A to 13E are exemplary diagrams showing the configuration of the hinge unit in detail.
Figures 13A, 13B:
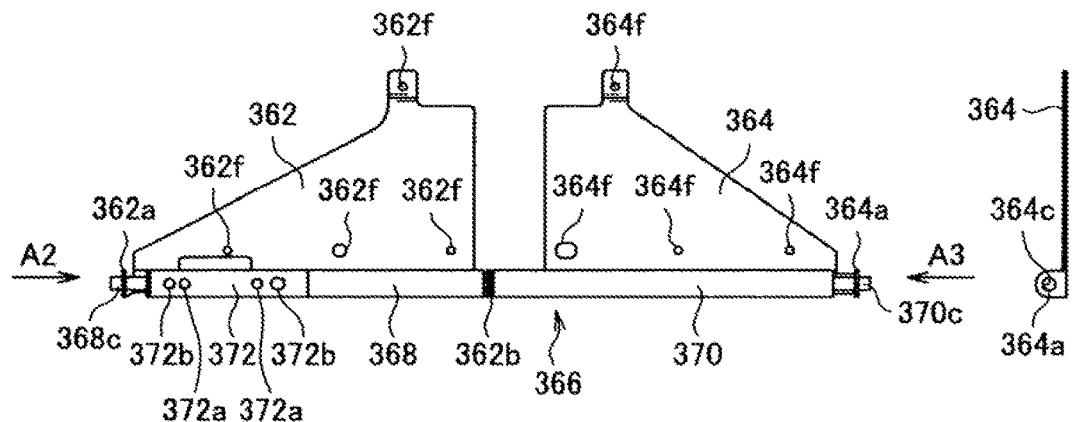
Figure 13D:
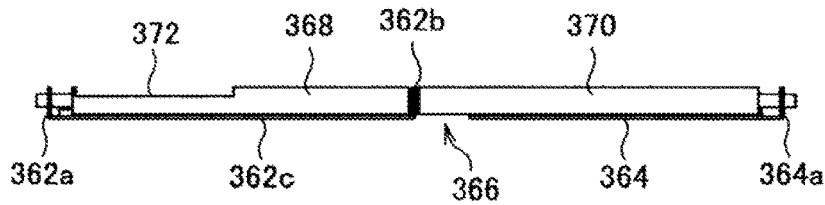
Figure 13E:
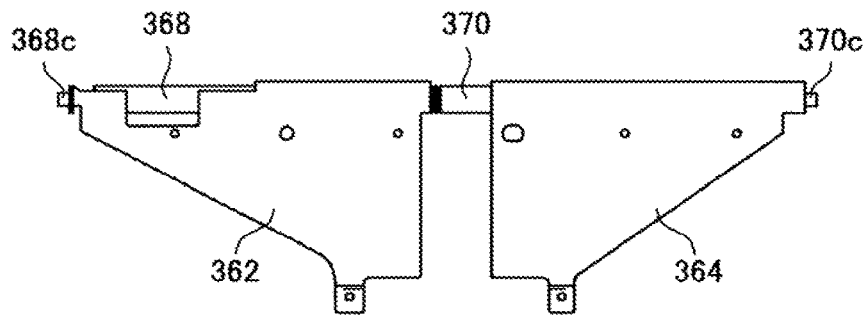

Furthermore, FIGS. 13A to 13E are exemplary diagrams showing the configuration of the hinge unit 360 in detail. Here, FIG. 13A shows a front view of the hinge unit 360 seen from the back side of the display displaying unit 300, FIG. 13B shows a right side view, FIG. 13C shows a top view, FIG. 13D shows a bottom view, FIG. 13E shows a rear view, respectively.

The shaft 366 of the hinge unit 360 is fixed to the arm unit 200. As shown in FIGS. 4A to 4G, the distal end of the upper part of the arm unit 200 is provided with a receiving surface 202 to which the shaft 366 is attached. The receiving surface 202 are provided with bosses 202a and openings 202b.

Figure 12:
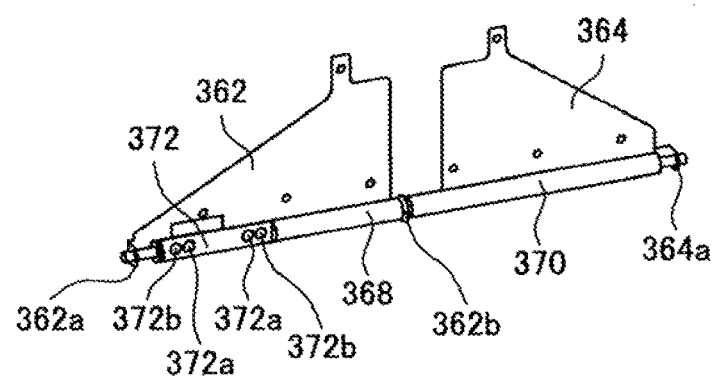
FIG. 12 is a perspective view showing a configuration of a hinge unit.

Furthermore, as shown in FIG. 12, a flat surface 372 is provided at a part of the peripheral surface of the shaft 366. The flat surface 372 is provided with openings 372a into which the bosses 202a of the receiving surface 202 of the arm unit 200 are inserted. Furthermore, the flat surface 372 is provided with screw holes 372b at positions corresponding to the openings 202b.

The flat surface 372 is contacted with the receiving surface 202 of the arm unit 200, and the bosses 202a are inserted into the openings 372a. In this state, screws are inserted into the openings 202b from the back side of the arm unit 200 and are tightened to the screw holes 372b, and thereby the shaft 366 is fixed to the arm unit 200. Because of this, the shaft 366 of the hinge unit 360 and the arm unit 200 are integrated as shown in FIG. 11. Then, the integrated shaft 366 and the arm unit 200 become a rigid member supporting the display displaying unit 300.

The shaft 366 is arranged horizontally along the lower edge of the display displaying unit 300. The first hinge plate 362 and the second hinge plate 364 are rotatably engaged with the shaft 366, with the shaft 366 as the central axis of rotation.

As shown in FIG. 13A, the first hinge plate 362 is provided with a plurality of openings 362f. Furthermore, the second hinge plate 364 is provided with a plurality of openings 364f. These openings 362f and 364f correspond to the positions of the screw holes 342 of the base plate 340, and the first hinge plate 362 and the second hinge plate 364 are fixed to the base plate 340, by the screws inserted into the openings 362f and 364f being tightened to the screw holes 342 of the base plate 340, with the T-substrate 350 interposed in between the base plate 340. Because of this, the first hinge plate 362 and the second hinge plate 364 become strength members for ensuring the rigidity of the display displaying unit 300 with the base plate 340.

FIGS. 14A to 14C are exemplary diagrams showing a configuration of the shaft 366 in detail. Here, FIG. 14A shows a front view of the shaft 366 seen from the back side of the display displaying unit 300, a right side view, and a left side view, respectively. Furthermore, FIG. 14B shows a cross section taken along the central axis of the shaft 366. Furthermore, FIG. 14C shows a cross section taken along a chain line IV-IV' in FIG. 14A.

As shown in FIGS. 14A to 14C, the shaft 366 is divided in the midsection, and the shaft 366 is configured by the two of shaft 368 and shaft 370. The above-described flat surface 372 is provided at the shaft 368.

As shown in FIG. 14A and FIG. 14B, a groove 375 is provided at the site where the shaft 368 and the shaft 370 are coupled. Furthermore, the end of the shaft 368 is provided with an engagement shaft 368a which is inserted into an engagement hole 370a of the shaft 370. The end of the shaft 370 is provided with a flat surface 370g.

As shown in FIG. 14B, the engagement shaft 368a of the shaft 368 is provided with two openings 368b into which pins 369 are to be inserted. Furthermore, the site where the flat surface 370g of the shaft 370 is formed is provided with two openings 370b into which the pins 369 are to be inserted.

The shaft 368 and the shaft 370 are fixed by the pins 369 being inserted into the openings 368b and the openings 370b, with the engagement shaft 368a inserted and caulked into the engagement hole 370a. At this time, the outside diameters of the pins 369 are fitted and fixed to the inside diameters of the openings 368b and the openings 370b by the caulking.

As shown in FIG. 14A, an engagement shaft 368c is provided at the end of the shaft 368 on the other side of the engagement shaft 368a. Furthermore, an engagement shaft 368d is provided at the position of the groove 357. Furthermore, the engagement shaft 368c is provided with a hole 368e of a predetermined depth along the central axis. Furthermore, a part of the end surface of the engagement shaft 368c is provided with an engagement groove 368f of a predetermined depth.

Similarly, the end of the shat 370 is provided with an engagement shaft 370c. The engagement shaft 370c is provided with a hole 370e of a predetermined depth along the central axis. Furthermore, a part of the end surface of the engagement shaft 370c is provided with an engagement groove 370f of a predetermined depth.

As shown in FIG. 12 and FIGS. 13A to 13E, two engagement parts 362a and 362b which engage with the engagement shafts 368c and 368d at the both ends of the shaft 368 are provided at the both ends of the first hinge plate 362 by bending work. The engagement parts 362a and 362b are each provided with a pass-through opening 362c (not shown in FIG. 12 and FIGS. 13A to 13E).

Furthermore, an engagement part 364a which engages with the engagement shaft 370c provided at the one end of the shaft 370 is formed at one end of the second hinge plate 364 by bending processing. As shown in FIG. 13B, the engagement part 364a is provided with a pass-through opening 364c.

FIGS. 15A and 15B are_exemplary diagrams showing that the first hinge plate 362 and the second hinge plate 364 are engaged with the shaft 366, and shows the shaft 366 seen from under the display displaying unit 300. Here, FIG. 15A shows that the first hinge plate 362 is rotatably attached to the shaft 366. Furthermore, FIG. 15B shows that the second hinge plate 364 is rotatably attached to the shaft 366.

As shown in FIG. 15A, the pass-through opening 362c of the engagement part 362a of the first hinge plate 362 is inserted into the engagement shaft 368c of the shaft 368, with a washer 378 inserted into the engagement shaft 368c. Furthermore, the pass-through opening 362c of the engagement part 362b is inserted into the engagement shaft 368d. Then, a lock position determining plate 380 is attached to the distal end of the engagement shaft 368c with a spring washer 379 inserted into the engagement shaft 368c, and a caulking pin 382 is driven into the hole 368e, and thereby the caulking pin 382 is fixed to the hole 368e. Because of this, the lock position determining plate 380 is fixed to the distal end surface of the engagement shaft 368c, and the first hinge plate 362 is rotatably attached to the shaft 368.

Furthermore, as shown in FIG. 15B, the pass-through opening 364c of the engagement part 364a of the second hinge plate 364 is inserted into the engagement shaft 370, with a washer 378 inserted to the engagement shaft 370c, and furthermore, a spring washer 379 is inserted into the engagement shaft 370c. Then, a lock position determining plate 380 is attached to the distal end of the engagement shaft 370c, and a caulking pin 382 is driven into the hole 370e, and thereby the caulking pin 382 is fixed to the hole 370e. Because of this, the lock position determining plate 380 is fixed to the distal end surface of the engagement shaft 370c, and the second hinge plate 364 is rotatably attached to the shaft 370.

When the hinge unit 360 is assembled, at first, the pass-through opening 362c of the engagement part 362b of the first hinge plate 362 is inserted into the engagement shaft 368d of the shaft 368, with the shaft 366 separated into the shaft 368 and the shaft 370. Next, the washer 378 is inserted into the engagement shaft 368c, and the pass-through opening 362c of the engagement part 362a is inserted into the engagement shaft 368c.

Next, the engagement shaft 368a of the shaft 368 is inserted into the engagement hole 370a of the shaft 370, the pins 369 are inserted and caulked into the openings 368b and the openings 370b, and thereby the shaft 368 and the shaft 370 are fixed and integrated. Because of this, the groove 375 is formed between the shaft 368 and the shaft 370, and the engagement part 362b is engaged with the engagement shaft 368d in the groove 375.

Next, the washer 378 is inserted into the engagement shaft 370c of the shaft 370, and the pass-through opening 364c of the engagement part 364a of the second hinge part 364 is inserted into the engagement shaft 370c. Then, the spring washers 379 are inserted into the engagement shaft 368c and the engagement shaft 370c at the both ends of the shaft 366, the lock position determining plates 380 are attached to the distal end surfaces of the engagement shaft 368c and the engagement shat 370c, and the caulking pins 382 are inserted caulked into the hole 368e and the hole 370e.

The first hinge plate 362 is rotatably supported with respect to the shaft 366 since the pass-through openings 362c of the engagement part 362a and 362b provided at two positions are rotatably engaged with the engagement shafts 368c and 368d at the both ends of the shaft 368. Furthermore, the second hinge plate 364 is rotatably supported with respect to the shaft 366 since the pass-through opening 364c of the engagement part 364a provided at one location is rotatably engaged with the engagement shaft 370c at one end of the shaft 370. Therefore, both of the first hinge plate 362 and the second hinge plate 364 are rotatably attached to the shaft 366.

Therefore, by the first hinge plate 362 and the second hinge plate 364 being attached to the base plate 340, the display displaying unit 300 can be rotatably supported, with the shaft 366 a rigid member as the central axis of rotation.

In the present embodiment, the two of the first hinge plate 362 and the second hinge plate 364 are rotatably supported with respect to the shaft 366, but one hinge plate may be rotatably supported. However, when the shaft 366 is long, if one hinge plate is rotatably supported by the engagement parts provided at the both ends of the hinge plate, the hinge plate may be deformed in a direction away from the shaft at the middle part in the longitudinal direction of the shaft 366. Furthermore, the hinge plate may be twisted in the rotating direction and difference in rotation angle position between at the both ends of the hinge plate may be occurred, and thereby the rotation of the hinge plate may not be performed smoothly. On the other hand, as in the present embodiment, if the hinge plate is divided into the first hinge plate 362 and the second hinge plate 364 and two engagement parts 362a and 362b are provided at the both ends of the first hinge plate 362, the number of engagement with the shaft 366 can be increased to three places at the whole hinge plate, so that the hinge plate can be suppressed from being deformed in the direction away from the shaft near the middle part of the shaft 366. Furthermore, by the hinge plate being divided, the rigidity of each hinge plate is increased and the twist of the hinge plate can be suppressed, so that the rotation angle positions of the first hinge plate 362 and the second hinge plate 368 at the both ends of the shaft 366 can be the same. Therefore, the first hinge plate 362 and the second hinge plate 368 can be smoothly rotated with respect to the shaft 366, and the tilt operation of the display displaying unit 300 can be smoothly performed.

Rotation Locking Mechanism of Hinge Plates

Figure 16:
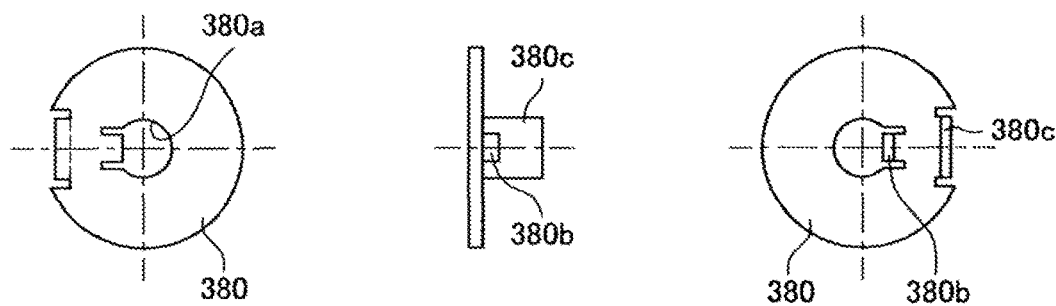
FIG. 16 is exemplary diagrams showing a configuration of a lock position determining plate.

FIG. 16 is exemplary diagrams showing a configuration of the lock position determining plate 380. The lock position determining plate 380 is formed by press working a plate material. As shown in FIG. 16, the lock position determining plate 380 is provided with an opening 380a to which a caulking pin 382 is inserted into, a projection part 380b which engages with the engagement grooves 368f and 370f at the distal end of the engagement shafts 368c and 370c, and a projection part 380c which determines the rotation lock positions of the first hinge plate 362 and the second hinge plate 364.

Figure 17A:
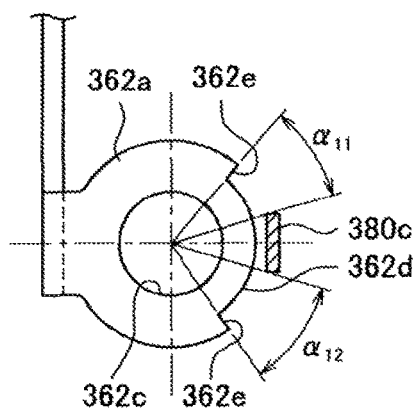
FIGS. 17A and 17B are exemplary diagrams showing the rotational positions of the first hinge plate and the second hinge plate which are determined by the lock position determining plate.
Figure 17B:
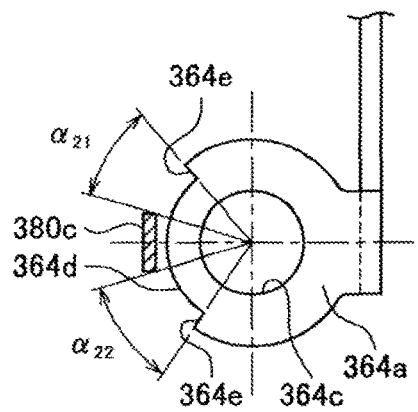

FIGS. 17A and 17B are exemplary diagrams showing the rotational positions of the first hinge plate 362 and the second hinge plate 364 which are determined by the projection part 380c of the lock position determining plate 380. Here, FIG. 17A shows the engagement part 362a of the first hinge plate 362 seen from the direction of an arrow A2 in FIG. 13A. Furthermore, FIG. 17B shows the engagement part 364a of the second hinge plate 364 seen from the direction of an arrow A3 in FIG. 13A.

As shown in FIG. 17A, a concave part 362d is formed along the contour of the engagement part 362a of the first hinge plate 362. It is configured such that, when the projection part 380b is inserted into the engagement groove 368f and the lock position determining plate 380 is attached to the distal end of the engagement shaft 368c, the projection part 380c of the lock position determining plate 380 is located at the position of the concave part 362d. Because of this, when the first hinge plate 362 rotates with the central axis of the shaft 366 as the center of rotation, end surfaces 362e on the both sides of the concave part 362d contact the projection part 380c, and thereby the rotatable range of the first hinge plate 362 is determined.

Similarly, as shown in FIG. 17B, a concave part 364d is formed along the contour of the engagement part 364a of the second hinge plate 364. It is configured such that, when the projection part 380b is inserted into the engagement groove 370f and the lock position determining plate 380 is attached to the distal end of the engagement shaft 370c, the projection part 380c of the lock position determining plate 380 is located at the position of the concave part 364d. Because of this, when the second hinge plate 364 rotates with the central axis of the shaft 366 as the center of rotation, end surfaces 364e on the both sides of the concave part 364d contact the projection part 380c, and thereby the rotatable range of the second hinge plate 364 is determined.

Here, the angular range between the two end surfaces 362e of the concave part 362d of the first hinge plate 362 and the angular range between the two end surfaces 364e of the concave part 364d of the second hinge plate 364 are the same. As shown in FIG. 14A, the engagement grooves 368f and 370f which determine the angular positions of the lock position determining plates 380 are located at the same angular positions with respect to the central axis of the shaft 366, by the relative angular positions of the shaft 368 and the shaft 370 being determined by the pins 369. Therefore, the angular position of the projection part 380c with respect to the two end surfaces 362e of the concave part 362d is the same as the angular position of the projection part 380c with respect to the two end surfaces 364e of the concave part 364d. Therefore, as shown in FIG. 17A and FIG. 17B, when the tilt of the display displaying unit 300 is moved upward, assuming that the movable angle of the first hinge plate 362 is all and the movable angle of the second hinge plate 364 is $\alpha 12$, the relation $\alpha 11 = \alpha 21$ holds. Furthermore, when the tilt of the display displaying unit 300 is moved downward, assuming that the movable angle of the first hinge plate 362 is $\alpha 12$ and the movable angle of the second hinge plate 364 is $\alpha 22$, the relation $\alpha 12 = \alpha 22$ holds.

Therefore, when the tilt of the display displaying unit 300 is moved upward or downward, the positions where the tilt is locked are the same between the first hinge plate 362 and the second hinge plate 364. Because of this, when the tilt positions are locked, the tilt positions can be simultaneously locked at the both ends of the shaft 366 and the occurrence of twist between the display displaying unit 300 and the shaft 366 can be reliably suppressed. Therefore, the upper side of the display displaying unit 300 can be suppressed from being tilted with respect to the central axis of the shaft 366 at the lock position, and there can be achieved a smooth movement of the display displaying unit 300.

Figure 18A:
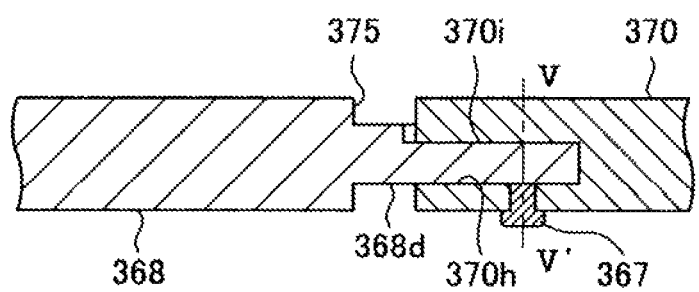
FIGS. 18A and 18B are exemplary diagrams showing another example of the configuration of the shaft.
Figure 18B:
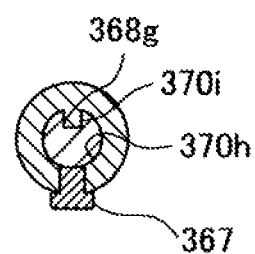

FIGS. 18A and 18B are exemplary diagrams showing another example of the configuration of connecting the shaft 368 and the shaft 370. Here, FIG. 18A shows a cross section taken along the central axis of the shaft 366. Furthermore, FIG. 18B is an exemplary diagram showing a cross section taken along a chain line V-V' in FIG. 18A. In the example of FIGS. 18A and 18B, the engagement shaft 368d of the shaft 368 is inserted into a hole 370h of the shaft 370, and a key 370i of the hole 370h is engaged with a key groove 368g of the engagement shaft 368d, so that the angular position of the shaft 368 and the shaft 370 is determined. The shaft 368 and the shaft 370 are configured by a caulking pin 367 for fixing being caulked into the shaft 370, so that the shaft 368 does not come off from the shaft 370. According to such a configuration as well, the angular position of the engagement groove 368f of the shaft 368 and the engagement groove 370f of the shaft 370 can be determined, and the positions where the tilt position is locked can be the same between the first hinge plate 362 and the second hinge plate 364.

Substrate Wiring Structure of Display Displaying Unit

Figure 19:
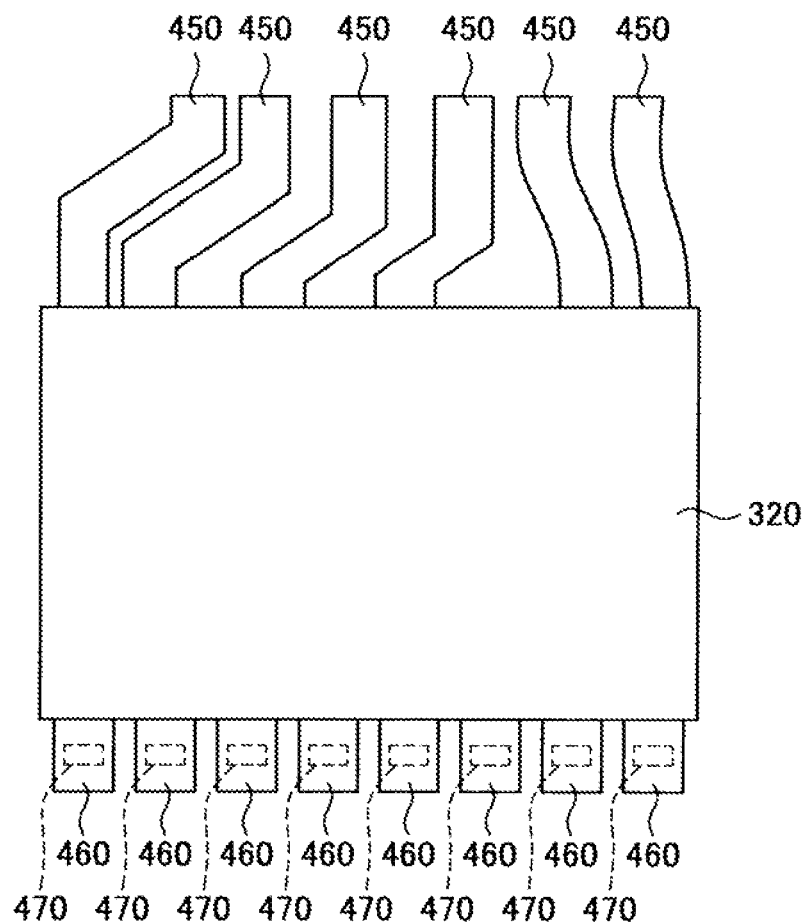
FIG. 19 is an explanatory diagram showing flexible printed circuit substrates and an organic EL panel which are connected to each other.

FIG. 19 is an explanatory diagram showing flexible printed circuit substrates 450 and 460 for connecting the organic EL panel 320 and the T-substrate 350, connected with the organic EL panel. As shown in FIG. 19, the flexible printed circuit substrates 450 provided with power supply lines are connected to the upper end of the organic EL panel 320. Furthermore, the flexible print substrates 460 provided with signal lines are connected to the lower end of the organic EL panel 320. A driver IC 470 is mounted on the flexible printed circuit substrate 460. The driver IC 470 is a driver IC which transmits control signals for allowing each of the organic EL devices of the organic EL panel 320 to emit light.

Figure 20:
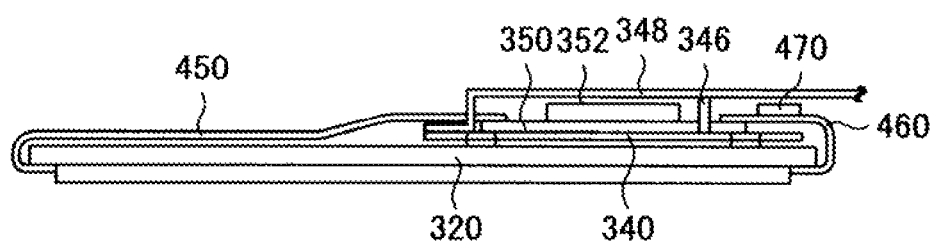
FIG. 20 is an explanatory diagram showing the display displaying unit with the configuration shown in FIG. 23 incorporated thereinto.

FIG. 20 is an explanatory diagram showing the display displaying unit 300 where the configuration shown in FIG. 19 is incorporated thereinto and shows the organic EL panel 320, the base plate 340, the T-substrate 350, and the flexible printed circuit substrates 450 and 460, seen from the side of the display displaying unit 300.

As shown in FIG. 20, the flexible printed circuit substrates 450 pulled out from the upper end of the organic EL panel 320 are folded back by 180°, and are connected to the T-substrate 350. Furthermore, the flexible printed circuit substrates 460 pulled out from the lower end of the organic EL panel 320 are folded back by 180° and are connected to the T-substrate 350. Therefore, the T-substrate 350 is not necessarily arranged on the entire surface of the organic EL panel 320 at the rear of the organic EL panel 320, and the occupied region by the T-substrate 350 can be suppressed to the minimum.

Because of this, the T-substrate 350 can be arranged in a minimal range at the lower part of the organic EL panel 320, and in particular, the thickness of the display displaying unit 300 can be suppressed to the minimum in the region upper than the T-substrate 350. The thickness of the display displaying unit 300 is mainly determined by the organic EL panel 320, the graphite sheet 330, and the rear cover 420 in the region where the T-substrate 350 is not arranged, so that the thickness of the display displaying unit 300 can be made very thin at about 3 mm as described above, and there can be configured the display displaying unit 300 full of feeling of airiness and floating.

Furthermore, the flexible printed circuit substrates 450 and 460 pulled out from the T-substrate 350 are folded back by 180° and are connected to the organic EL panel 320, and thereby electrical connection between the organic EL panel 320 and the T-substrate 350 can be performed without expanding the external form of the organic EL panel 320. Therefore, according to the substrate wiring structure of the display displaying unit 300 of the present embodiment, the size of the display displaying unit 300 can be suppressed to the minimum, and there can be achieved the miniaturization of the display displaying unit 300.

Furthermore, FIG. 20 shows the base plate 340 is coupled with a supporting member 348 (the first hinge plate 362 and the second hinge plate 364) for supporting the base plate 340. The base plate 340 is adhered and coupled to at least a part of the supporting member 348 or is coupled with the supporting member 348 via a fixing part 346. As described above, the base plate 340 is coupled to the first hinge plate 362 and the second hinge plate 364 which serve as the supporting member 348, but when the display displaying unit 300 is not provided with a tilt adjustment mechanism, for example, the supporting member 348 shown in FIG. 20 can be a configuring member such as a stand arm arranged standing upward from the body stand unit. In this case as well, the main members configuring the display displaying unit 300 such as the base plate 340 and the T-substrate 350 are arranged at the lower part of the display displaying unit 300 in a concentrated manner, so that especially the thickness of the upper side of the display displaying unit 300 can be suppressed to the minimum.

Heat Dissipation Structure by Using Hinge Unit

The T-substrate 350 is provided with the power supply lines and the signal lines which are connected with the organic EL panel 320 are provided. Furthermore, electrical components 352 are mounted on the T-substrate 350. In the present embodiment, as shown in FIG. 11, the T-substrate 350 is arranged between the first hinge plate 362 and the second hinge plate 364 of the hinge unit 360, and the base plate 340. Because of this, heat generated at the T-substrate 350 or the electronic components 352 by the circuit driving is transferred to the first hinge plate 362 and the second hinge plate 364 made of metal having high heat conductivity, and is diffused. Therefore, the heat of the T-substrate 350 can be efficiently dissipated. The heat transferred to the first hinge plate 362 and the second hinge plate 364 is dissipated to the outside via the rear cover 420 and the T-cover 430 which are made of metal. Therefore, the display displaying unit 300 is reliably suppressed from being heated by the heat generation of the T-substrate 350. In order that the heat transfer from the T-substrate 350 or the electronic components 352 to the first hinge plate 362 and the second hinge plate 364 is efficiently performed, the T-substrate 350 or the electronic components 352 may contact the first hinge plate 362 and the second hinge plate 364 via a heat conductive member.

Figure 21:
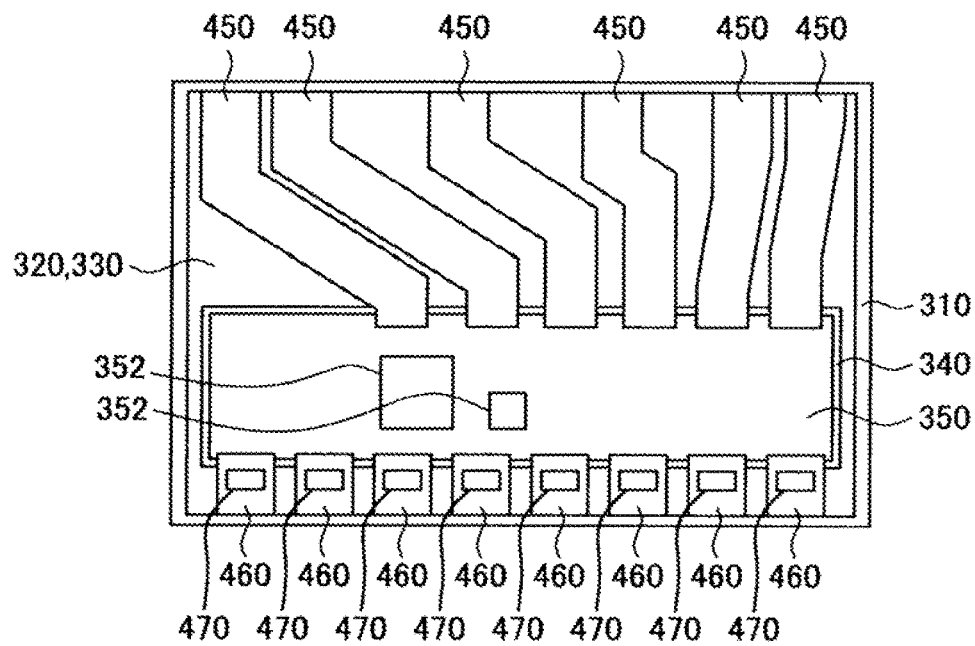
FIG. 21 is an exemplary diagram showing the display displaying unit in FIG. 24 seen from the back side thereof.

FIG. 21 is an exemplary diagram showing the display displaying unit 300 in FIG. 20 seen from the back side thereof. As shown in FIG. 21, a plurality of flexible printed circuit substrates 460 pulled out from the lower end of the organic EL panel 320 are folded back by 180° and are connected to the T-substrate 350, so that the driver ICs 470 are arranged in the straight line in a horizontal direction. The drivers IC 470 are arranged near the shaft 366 along the extending direction of the shaft 366.

Figure 22:
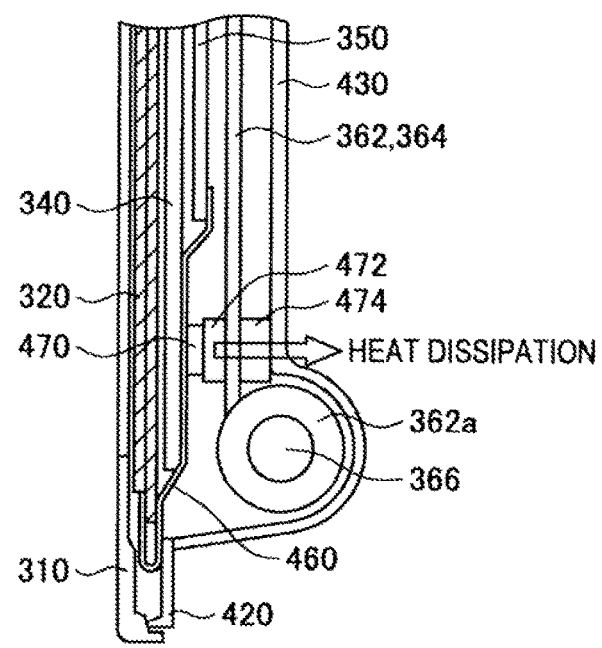
FIG. 22 is an exemplary diagram showing a cross section near the shaft.

FIG. 22 is an exemplary diagram showing a cross section near the shaft 366 of the display displaying unit 300. As shown in FIG. 22, the driver ICs 470 mounted on the flexible printed circuit substrates 460 are arranged at the positions of the root of the first hinge plate 362 and the second hinge plate 364.

As shown in FIG. 22, the driver ICs 470 are connected and the first hinge plate 362 and the second hinge plate 364 via a heat dissipation sheet 472. Furthermore, the first hinge plate 362 and the second hinge plate 364 are connected with the rear cover 420 via a heat dissipation sheet 474.

According to such a configuration, the heat generated from the driver ICs 470 is transferred to the first hinge plate 362 and the second hinge plate 364 via the heat dissipation sheet 472, and is diffused. The heat of the first hinge plate 362 and the second hinge plate 364 is transferred to the rear cover 420 via the heat dissipation sheet 474 and is dissipated to the outside of the display displaying unit 300. Since the rear cover 420 is made of metal, the heat dissipation effect can be enhanced. Therefore, the heat within the display displaying unit 300 can be efficiently dissipated.

The driver ICs 470 are arranged along the lower end of organic EL panel 320 in the column direction (horizontal direction) of the panel in order to control the signals of each organic EL device arranged on the organic EL panel 320. Furthermore, the shaft 366 of the hinge unit 360 is also arranged along the lower end of the organic EL panel 320 extending in the horizontal direction in order to make the tilt position of the display displaying unit 300 changeable. Therefore, in the display device 1000 of the present embodiment, the array direction of the driver ICs 470 and the extending direction of the shaft 366 of the hinge unit 360 can be the same direction, and the driver ICs 470 can be arranged with the first hinge plate 362 and the second hinge plate 364. Therefore, the heat generated in the drivers IC 470 can be reliably dissipated via the first hinge plate 362 and the second hinge plate 364.

Figure 23:
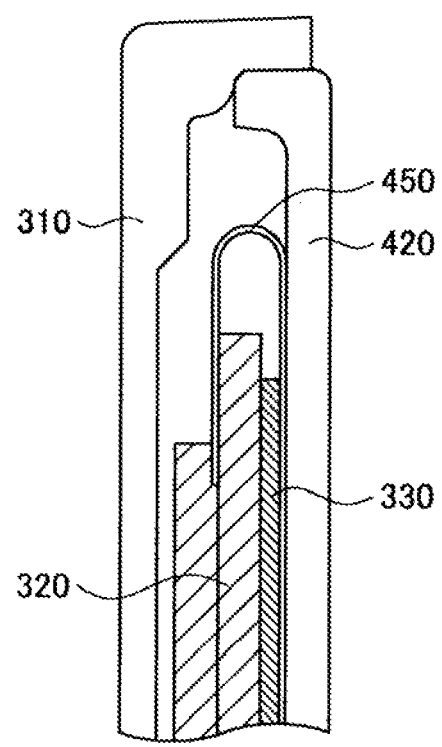
FIG. 23 is an exemplary diagram showing a cross-sectional configuration of the upper part of the display displaying unit.

FIG. 23 is an exemplary diagram showing a cross-sectional configuration of the upper part of the display displaying unit 300. As shown in FIG. 23, a plurality of flexible printed circuit substrates 450 pulled out from the upper end of the organic EL panel 320 are folded back by 180°, and are led to the T-substrate 350 on the lower side in the state being adhered to the rear cover 420. The graphite sheet 330 is attached to the front of the back surface of the organic EL panel 320, and the flexible printed circuit substrates 450 are located between the graphite sheet 330 and the rear cover 420.

According to such a configuration, the heat generated in the organic EL panel 320 is transferred to the graphite sheet 330, and are diffused and equalized in the graphite sheet 330. The heat diffused in the graphite sheet 330 is transferred to the rear cover 420, and is dissipated to the outside from the rear cover 420. Since the rear cover 420 is made of metal, the heat dissipation effect can be enhanced. Therefore, the internal heat is efficiently dissipated to the outside from the rear cover 420 also at the upper part of the display displaying unit 300.

As above, although a preferred embodiment of the present invention is described with reference to the accompanying drawings, the present invention is not limited thereto as a matter of course. It is obvious to those skilled in the art that various alternations and modifications may be made without departing from the scope of the claims and thus are intended for inclusion within the technical scope of the present invention.

The invention claimed is:

1. A display device, comprising:
an organic electro luminescence (EL) panel;
a hard substrate which is in a range narrower than the organic EL panel at a back side of the organic EL panel, wherein the hard substrate is in a region which is less than or equal to a lower half of the back side of the organic EL panel;
a first plurality of flexible printed circuit substrates which extend from an upper end of the hard substrate and are connected to the organic EL panel; and
a second plurality of flexible printed circuit substrates which extend from a lower end of the hard substrate and are connected to the organic EL panel,
wherein a thickness of the organic EL panel is less than or equal to about several millimeters.

\* \* \* \* \*